(12) United States Patent
Fujimura

(10) Patent No.: US 7,416,351 B2
(45) Date of Patent: Aug. 26, 2008

(54) OPTICAL SUBASSEMBLY INSTALLING THERMISTOR THEREIN

(75) Inventor: Yasushi Fujimura, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/635,080

(22) Filed: Dec. 7, 2006

(65) Prior Publication Data
US 2007/0147745 A1    Jun. 28, 2007

Related U.S. Application Data

(60) Provisional application No. 60/742,892, filed on Dec. 7, 2005.

(51) Int. Cl.
G02B 6/36 (2006.01)
H01L 27/00 (2006.01)
H01L 27/16 (2006.01)

(52) U.S. Cl. .................. 385/88; 257/432; 257/467
(58) Field of Classification Search .............. None
See application file for complete search history.

(56) References Cited

U.S. PATENT DOCUMENTS

| | | | |
|---|---|---|---|
| 5,684,667 A | * | 11/1997 | Hsieh .................. 361/119 |
| 6,806,547 B2 | * | 10/2004 | Kohmoto et al. .......... 257/433 |
| 6,868,104 B2 | * | 3/2005 | Stewart et al. ............ 372/36 |
| 7,218,657 B2 | * | 5/2007 | Kihara et al. ........... 372/43.01 |
| 2005/0175312 A1 | * | 8/2005 | Tanaka et al. ........... 385/147 |
| 2006/0062526 A1 | * | 3/2006 | Ikeuchi .................... 385/88 |

FOREIGN PATENT DOCUMENTS

JP    05-243588 A    9/1993

\* cited by examiner

*Primary Examiner*—Hemang Sanghavi
*Assistant Examiner*—Omar Rojas
(74) *Attorney, Agent, or Firm*—Venable LLP; Michael A. Sartori; Steven J. Schwarz

(57) ABSTRACT

The present invention is to provide an optical subassembly with a co-axial package that enables to sense the temperature of the devices mounted within the subassembly with a relatively inexpensive chip thermistor. The subassembly includes a co-axial package and a FPC board to connect the subassembly to the outer circuit. The thermistor is mounted on the FPC board such that one electrode thereof is connected to a pattern formed on a surface opposite to a surface facing the subassembly and the other electrode is soldered to a via hole connecting two surfaces of the FPC board and this via hole is soldered directly to the subassembly.

7 Claims, 4 Drawing Sheets

OPTICAL SUBASSEMBLY INSTALLING THERMISTOR THEREIN

CROSS-REFERENCE TO RELATED APPLICATION

The present application claims priority from U.S. Provisional Application No. 60/742,892 filed on Dec. 7, 2005 and entitled "Optical Assembly with thermistor."

BACKGROUND OF THE INVENTION

1. Field of the Invention

The present invention relates to an optical subassembly installed in an optical transceiver, in particular, the invention relates to a receiver optical subassembly.

2. Related Prior Art

The conventional receiver optical subassembly (ROSA) is configured to install a temperature sensing device such as a thermistor and to adjust a bias voltage applied to a light-sensing device based on a temperature sensed by the thermistor. Especially, when an avalanche photodiode (APD) is used as the light-sensing device, it is required to adjust the bias voltage applied thereto based on an ambient temperature because the multiplication factor of the APD strongly depends on the temperature of the device. Japanese patent application published as JP-H05-243588A has disclosed an optical module installing the APD and a heat sink that serves as a bottom plate of the module package. On the bottom plate is installed a Peltier device, and the APD is mounted on the cooled plate of the Peltier device with a thermistor. The thermistor senses the temperature of the cooled plate to adjust the magnitude of the driving current supplied to the Peltier device. Thus, the temperature of the APD can be controlled.

When the optical subassembly is applied to an optical communication system whose bit rate is relatively low, for instance, slower than 2.5 Gbps, the optical subassembly is unnecessary to sense the temperature of the light-receiving device with the thermistor. However, if the bit rate of the optical communication system reaches 10 Gbps, or greater than 10 Gbps, it is typically adapted so that a box-shaped package, referred to as a butterfly package, is configured to mount a wiring substrate made of ceramic material on a bottom plate made of metal such as Kovar or copper tungsten (CuW), and to transmit signals on the interconnections that satisfies the impedance matching condition on the ceramic substrate.

Such a butterfly package generally provides enough space to install components therein compared with a cylindrical package, which is referred to as a co-axial package and is widely applied to the optical subassembly, and to form lead terminals in the side or bottom of the package to output the sensed signals from the thermistor. The thermistor installed in the package senses the case temperature of the package, which corresponds to the operating temperature of the APD to adjust the bias voltage applied thereto. Various characteristics of the APD, such as the breakdown voltage and the carrier multiplication factor, strongly depend on the temperature and, when the operating or ambient temperature of the APD varies, the bias voltage must be adjusted depending on the temperature.

However, the butterfly package has a fatal disadvantage that the price thereof is generally expensive compared to the co-axial package. Because the co-axial package is widely used not only in the optical communication system but also various consumer products, the price of the co-axial package is far cheaper than that of the butterfly package. In other words, this is the subject confronted with the optical subassembly.

Although the co-axial package has a great advantage in the price thereof compared to the butterfly package, the space for installing the components is quite small and restricts the number of lead pins that can electrically communicate with the outside of the package. The number of lead pins is restricted to from 4 to 6 at most. While, the standard ROSA requires 5 lead pins at least for the power supply of the pre-amplifier in the ROSA, the ground, the signals complementary to each other output from the pre-amplifier, and the bias voltage to the APD. This example assumes that the grounds for the preamplifier and that for the APD are common, but the grounds may be independent to each other depending on the application which requires an additional lead pin.

A standard ROSA has an outer shape with a diameter of 4 mm to 5.6 mm, which restricts the number of lead pins to be from 4 to 6 as already mentioned. Furthermore, the ROSA is necessary to install a sub-mount to mount the APD and capacitors to bypass the bias voltage to the APD. Thus, it may be said that the co-axial package has no space to add the thermistor therein.

FIG. 4 is a plan view of the conventional ROSA. The APD 14 is mounted in a center portion of the stem 2 through the die-capacitor 9. The APD 14 is mounted on the upper electrode 10 of the die-capacitor 9. In the immediate side of the die-capacitor 9 is directly mounted with a pre-amplifier 25 on the stem 2, and other die-capacitors, 17 and 18 are mounted on the stem 2 in the other side of the pre-amplifier 25 with respect to the APD 14. These die-capacitors operate as a bypassing capacitor for the power supply of the pre-amplifier 25 and for the bias voltage to the APD 14, respectively. These components are installed within an area surrounded by four lead pins, 5 to 8. The ground lead pin is directly attached to the surface opposite to the surface illustrated in FIG. 4 and the ground lead does not pass through the stem 2. Although this ROSA has the stem whose diameter is about 5 mm, recent requests are to make the diameter thereof as small as possible.

Thus, five lead pins are preserved for the signals, the bias supply, and the ground, and 4 lead pins except for the ground lead pin is necessary to pass through the stem. When the components are installed within the area surrounded by these 4 lead pins on the upper surface of the stem, it may leave almost no space to add another lead pin to transmit the signal relating to the temperature of the APD.

Moreover, two types of thermistor are available in the market, that is, a chip thermistor and a die thermistor. The former device has a larger size compared to that of the latter device and two electrodes of the former device are necessary to be soldered to the substrate. While, the latter device, the die thermistor, has two electrodes in the top and bottom surfaces thereof, in which only the bottom electrode is necessary to be soldered, while, the top electrode may be wire-bonded. However, the die thermistor is generally expensive compared to the chip thermistor.

SUMMARY OF THE INVENTION

An optical subassembly according to the present invention has a feature that the package provides a co-axial package and a thermistor in the outside of the package to sense a temperature of a light-receiving device installed within the package. The thermistor is mounted on a flexible printed circuit board connected to lead pins extruding from the package and shows an equivalent function when the thermistor is mounted within the package.

That is, one electrode of the thermistor is connected, in one surface of the flexible printed circuit board, to a via hole provided on the flexible printed circuit board and this via hole is directly soldered, in the other surface of the flexible printed circuit board, to the stem where the light-receiving device is mounted thereon. Thus, the thermistor may effectively sense the temperature of the light-receiving device even if the thermistor is installed outside of the package.

DESCRIPTION OF PREFERRED EMBODIMENTS

Figure 1:
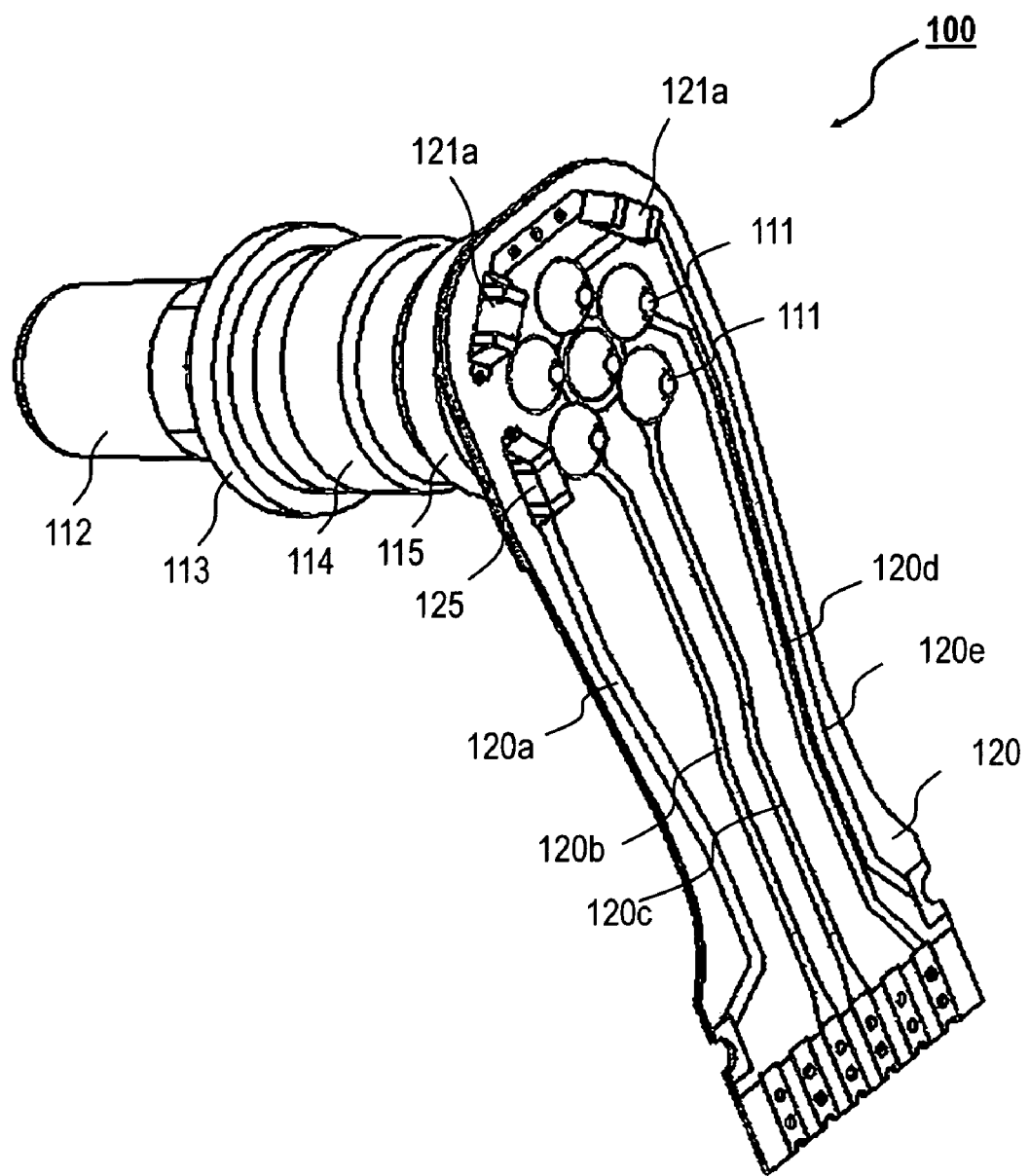
FIG. 1 is a perspective view showing the optical subassembly that mounts the thermistor on the FPC board according to the present invention.

Next, an optical subassembly according to the present invention will be described as referring to accompanying drawings. In the drawings, the same numerals or symbols will refer to the same elements without overlapping explanations.

FIG. 1 is a perspective view of a receiver optical subassembly 100 with a flexible printed circuit (FPC) board 120. Generally, the subassembly 100 includes only a cylindrical portion 110 except for the FPC board 120. The subassembly 100 provides a cylindrical sleeve 112 in the tip portion thereof. The sleeve 112 receives a ferrule with a cylindrical shape attached to and securing the optical fiber to optically couple the optical fiber with a semiconductor optical device and an avalanche photodiode (APD) in the present embodiment.

Between the sleeve 112 and the disk-shaped stem 115 are inserted two cylindrical components, 113 and 114. These components are to position the subassembly 110 in the optical transceiver automatically and precisely and to optically align the APD on the stem 115 with the sleeve 112. The cylindrical components, 113 and 114, may be a cap 114 to adiabatically seal the space within which the optical device is mounted and an alignment member 113 to adjust a distance between the tip of the optical fiber inserted into the sleeve 112 and the APD.

Figure 4:
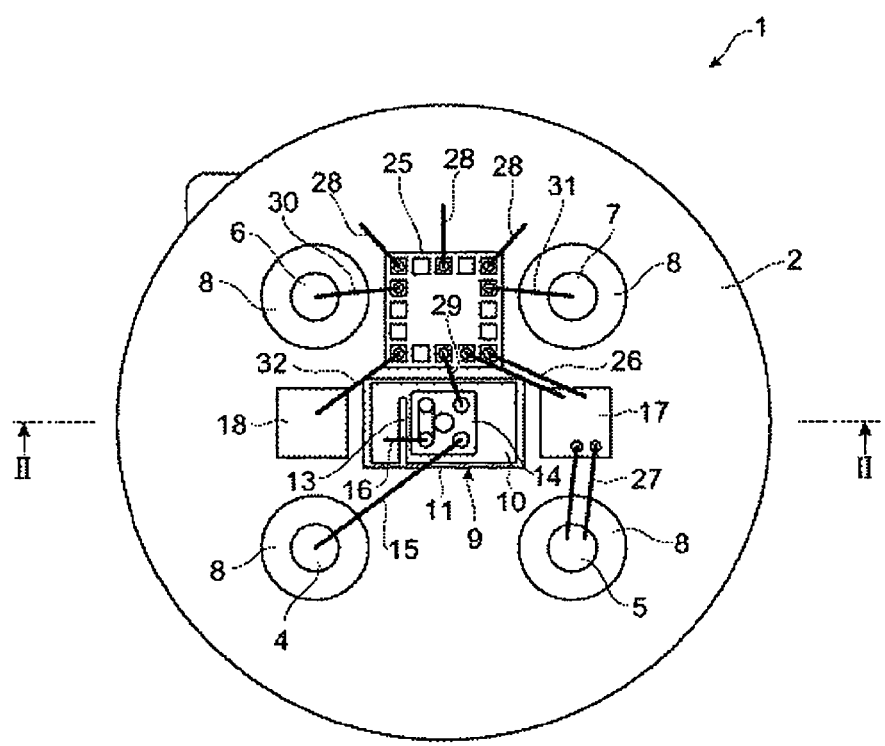
FIG. 4 is a plan view showing the inner arrangement of the optical subassembly.

On the stem 115 is mounted a plurality of components mentioned in accordance with FIG. 4. A plurality of lead pins 111 extrude from the back surface of the stem 115. A configuration of the lead pins 111 is illustrated in FIG. 1, where a center lead pin, which is the ground lead pin, is surrounded by five pins for the signals and power supplies. These five lead pins are arranged on the same circle. The FPC board 120 is directly attached to the lead pins 111.

Figure 3:
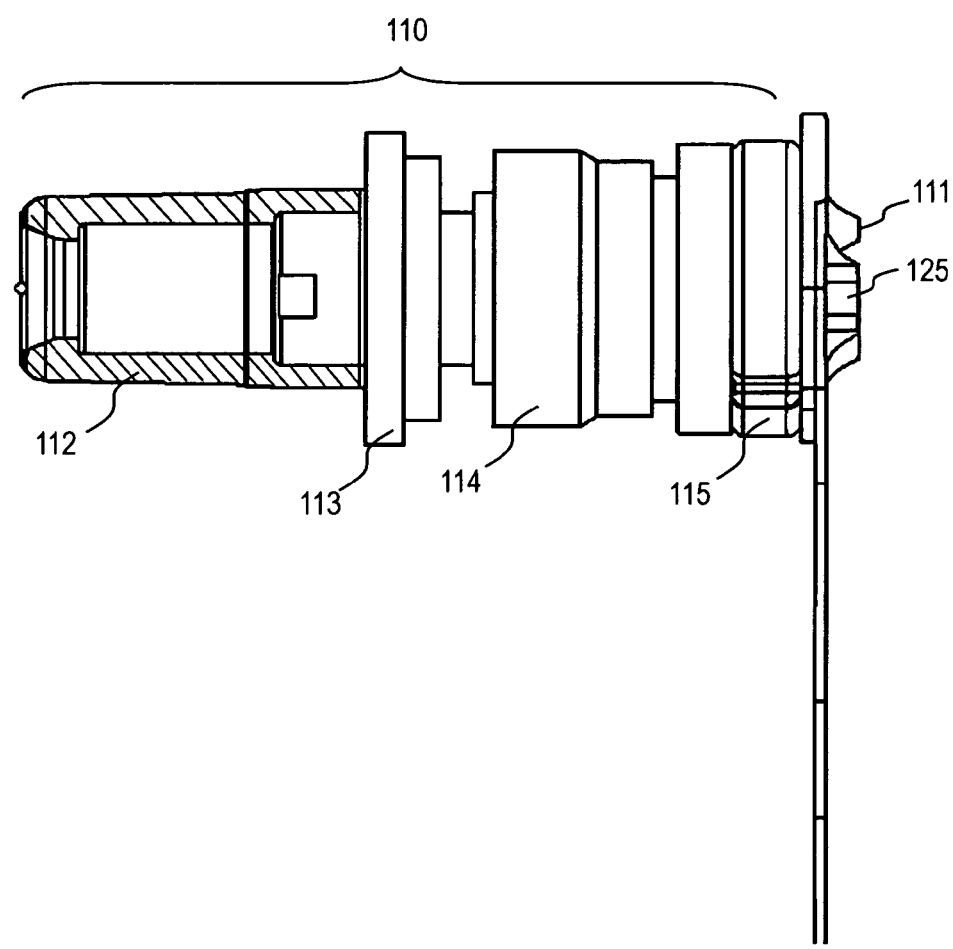
FIG. 3 is a side view of the optical subassembly that mounts the thermistor on the FPC board.

FIG. 3 is a side view showing the connecting configuration between the cylindrical portion 110 and the FPC board 120. FIG. 3 partially illustrates a cross section of the cylindrical portion 110, in particular, the sleeve 112 is shown by the cross section. The FPC board 120 is soldered in one surface thereof with the lead pin 111 such that the other surface comes directly in contact to the stem 115. The one surface of the FPC board 120, which comes in contact with the stem 115, has the ground pattern in almost the whole surface thereof. A portion of the ground pattern 121a is connected not only to the thermistor 125 but also to the stem 115. Thus, the heat generated by a device mounted on the stem 115 may be effectively conducted to the surface of the FPC board 120. Moreover, since the thermistor 125 is mounted on the surface of the FPC board 120, the temperature of the stem 115, which is equivalent to the temperature of the device mounted on the stem 115, can be effectively sensed by the thermistor.

For the subassemblies applied to the recent optical communication system whose transmission speed reaches and often exceeds 10 Gbps, the FPC board is generally used to electrically connect the subassembly with a primary circuit board and is also installed within the optical transceiver. Installing devices on the surface of the FPC board may solve the subject already mentioned that no additional space may be secured within the subassembly.

Figure 2A:
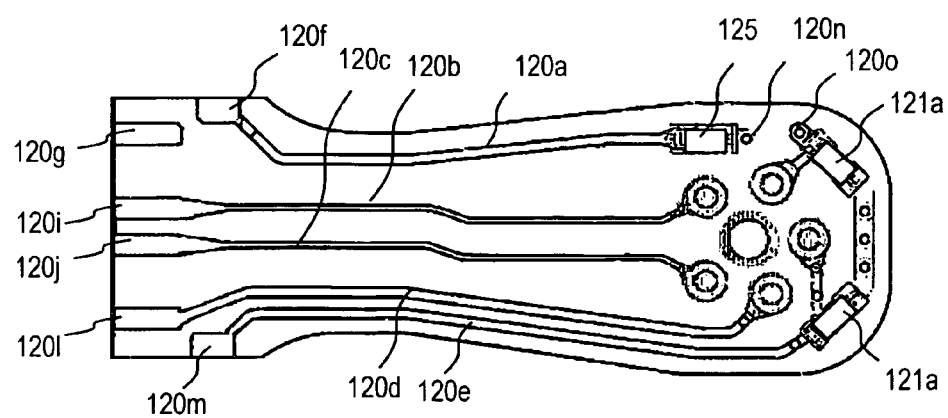
FIG. 2A is a plan view of the interconnections on the primary surface of the FPC board.
Figure 2B:
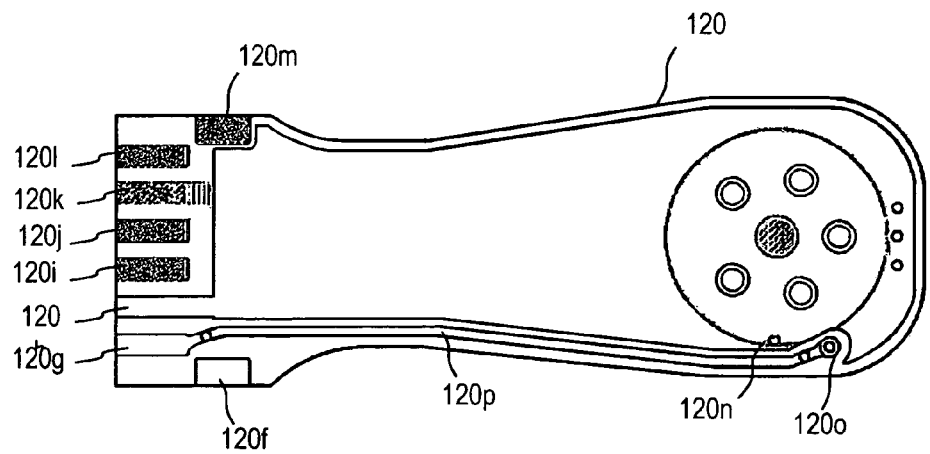
FIG. 2B is a plan view of the interconnections on the back surface of the FPC board.

FIGS. 2A and 2B show top and back surfaces of the FPC board 120 according to the present invention, respectively. The subassembly is connected in one side, a right side in FIG. 2, while, the primary circuit board is connected in the other side, a left side. The pads on the edge of the FPC board 120 have functions shown below:

TABLE I

| Symbol | Assigning of Pads Assignment |
|---|---|
| 120f | Signal form the thermistor |
| 120g | Power supply Vcc to the pre-amplifier |
| 120h | Signal ground |
| 120i | Signal Sig(+) from the pre-amplifier |
| 120j | Signal Sig(−) from the pre-amplifier |
| 120k | Signal ground |
| 120l | Internal connection (IC) |
| 120m | Bias supply Vapd to toe APD |

The reason for the electrodes, 120f and 120m, arranged in both end sides is to precisely sense the signal from the thermistor. The bias supply Vapd to the APD transmits a large signal compared to the output from the thermistor. Moreover, two signal lines, Sig(+) and Sig(−), transmit high frequency signals. Accordingly, the noise from the bias supply and the signal lines may be prevented from superposing on the signal output from the thermistor.

Two pads, 120i and 120j, transmit signals complementary to each other from the pre-amplifier and are connected to respective patterns, 120b ad 120c, on the FPC board each having the characteristic impedance. The characteristic impedance of the pattern on the FPC board is determined by a thickness and a material of the FPC board, and a width and thickness of the pattern. When the signal with the transmission speed thereof reaching 10 Gbps is transmitted in the pattern on the FPC board, it is preferable to match the characteristic impedance of the pattern with that of the electronic circuit mounted on the primary circuit board to secure the signal quality. When the transmission speed exceeds 10 Gbps, the impedance matched condition of the pattern on the FPC board is inevitable.

Therefore, the back surface of the FPC board 120, the surface opposite to the surface that arranges the patterns, 120i and 120j, has the ground plane in almost the whole area thereof to establish the co-planar line for the patterns, 120i and 120j. The embodiment shown in FIG. 2, the ground plane is common for the signals, the power supply Vcc for the pre-amplifier, and the bias supply Vapd for the APD.

The pad 120l is connected to some electrode of the component within the subassembly. That is, it is connected to a point within the subassembly which is unrestricted to a specific device or electrode. This configuration is to dissipate heat from the subassembly. Accordingly, this pad 120*l* is prohibited to be connected to a specific point including the ground in the outside of the subassembly. The pad 120*g* is for the power supply Vcc of the pre-amplifier, which is configured to be drawn in the back surface of the FPC board 120, to be brought up to the primary surface of the FPC board with a via hole 120*o*, to be bypassed by a capacitor 121*a*, and finally to be drawn within the subassembly by one of the lead pins 111. The pad 120*m* is for the bias supply Vapd of the APD, which is configured to be drawn in the primary surface of the FPC board 120, to be bypassed by another capacitor 121*a*, and finally to be drawn within the subassembly.

The pad 120*f* is for the thermistor 125. The pattern from this pad 120*f* is drawn in the primary surface of the FPC board 120 to the immediate point of the subassembly and is connected to the one electrode of the thermistor 125. The other electrode of the thermistor 125 is connected to the back surface of the FPC board 120 with a via hole 120*n*. The thermistor 125 is preferably soldered in the other electrode thereof on the land of the via hole 120*n*.

The via hole 120*n* is not only connected to the thermistor 125 but soldered directly to the stem in the back surface of the FPC board 120. The optical device and other devices generating heat within the subassembly are mounted on the stem, accordingly, the temperature of these devices mounted on the stem is effectively sensed by the thermistor by soldering the electrode of the thermistor directly to the stem.

In the arrangement of the thermistor and the FPC board according to the present invention, eight pads may be formed on the FPC board, which is greater than the number of lead pins configurable in the conventional co-axial package and, at the same time, the pad for the thermistor may be formed without affecting the arrangement of other pads for the other devices. Further, the present configuration for the thermistor makes it possible without any problems to use a chip thermistor, which reduces the cost of the subassembly.

While the invention has been shown and described with reference to specific preferred embodiments, it should be understood by those skilled in the art that various changes in form and detail may be made without departing from the spirit and scope of the invention as defined by the following claims. For example, the configuration to install the thermistor according to the present invention is not restricted to the ROSA, and may be applicable for the TOSA that installs an optical modulating device, which utilizes a variation of the optical absorption co-efficient of the semiconductor material due to the electro-absorption effect, integrated with a laser diode. Such device is necessary to sense the operating temperature thereof and to adjust the operating condition depending on the temperature. Accordingly, the specification and the embodiments are to be considered exemplary only, with a true scope and spirit of the invention being disclosed by the following claims.

What is claimed is:

1. An optical subassembly that includes a co-axial package including a disk-shaped stem and a cap that forms a space to install an optical device cooperated with the disk-shaped stem and a flexible printed circuit board connected to a plurality of lead pins extruding from the disk-shaped stem, further includes a thermistor mounted on the flexible printed circuit board, the thermistor having first and second electrodes, wherein the flexible printed circuit board provides a first surface facing the disk-shaped stem and a second surface opposite to the first surface the second surface mounting the thermistor such that the first electrode of the thermistor is directly connected to a via hole connecting the first surface of the flexible printed circuit board to the second surface of the flexible printed circuit board and the via hole is directly connected to the disk-shaped stem.

2. The optical subassembly according to claim 1,
wherein the thermistor is thermally connected with the disk-shaped stem.

3. The optical subassembly according to claim 1,
wherein the thermistor is a chip thermistor.

4. An optical module, comprising:
an optical subassembly including a package and a semiconductor optical device, the package providing a disk-shaped stem and a cap to form a space for installing the semiconductor optical device therein, the semiconductor optical device being mounted on the disk-shaped stem in the space;
a flexible printed circuit board connected to the optical subassembly, the flexible printed circuit board having a first surface facing the disk-shaped stem and a second surface opposite to the first surface; and
a chip thermistor with a first electrode and a second electrode, the chip thermistor being mounted on the second surface of the flexible printed circuit board such that the first electrode is thermally coupled with the disk-shaped stem to sense a temperature of the disk-shaped stem,
wherein the space installs no device to sense a temperature of the semiconductor optical device.

5. The optical module according to claim 4,
wherein the flexible printed circuit board provides a via hole connecting the first surface of the printed circuit board to the second surface of the printed circuit board, the via hole being directly connected to the first electrode of the chip thermistor in the second surface of the flexible printed circuit board and directly connected to the disk-shaped stem in the first surface of the flexible printed circuit board.

6. The optical module according to claim 5,
wherein the second surface of the flexible printed circuit board provides an interconnecting pattern connected to the second electrode of the chip thermistor.

7. The optical module according to claim 4,
wherein the semiconductor optical device is an avalanche photodiode.

* * * * *